United States Patent

Iga

[11] Patent Number: 6,124,738
[45] Date of Patent: Sep. 26, 2000

[54] INPUT BUFFER FOR SEMICONDUCTOR DEVICE

[75] Inventor: Hironori Iga, Hyogo, Japan

[73] Assignee: Mitsubishi Denki Kabushiki Kaisha, Tokyo, Japan

[21] Appl. No.: 09/195,453

[22] Filed: Nov. 18, 1998

[30] Foreign Application Priority Data

Jun. 9, 1998 [JP] Japan .................................. 10-160390

[51] Int. Cl.[7] .................................................. H03K 5/153
[52] U.S. Cl. .............................. 327/89; 327/77; 327/563
[58] Field of Search .............................. 327/77, 89, 108, 327/111, 112, 334, 333, 560, 563; 326/82, 83, 22, 23, 24

[56] References Cited

U.S. PATENT DOCUMENTS 5,541,538  7/1996  Bacrania et al. ........................ 327/89
5,568,074 10/1996  Kitaguchi et al. ....................... 327/89
5,581,206 12/1996  Chevallier et al. ...................... 327/77
5,666,075  9/1997  Schinzel ................................. 327/77

Primary Examiner—Toan Tran
Attorney, Agent, or Firm—McDermott, Will & Emery

[57] ABSTRACT

A voltage shift circuit included in an input buffer for a semiconductor integrated circuit device converts an external reference potential to a first signal of a predetermined potential. A voltage shift circuit converts the external signal obtained by superposing a logic signal of a small amplitude on an external reference potential to a second signal obtained by superposing a complementary signal of the logic signal with small amplitude on the first signal. Differential amplifying circuit compares the potentials of the first signal and the second signal and applies a signal corresponding to the result of comparison to internal circuitry. Therefore, normal operation is ensured even when an arbitrary potential between 1.25 V to 2.9 V is applied as the external reference potential.

5 Claims, 7 Drawing Sheets

INPUT BUFFER FOR SEMICONDUCTOR DEVICE

BACKGROUND OF THE INVENTION

1. Field of the Invention

The present invention relates to an input buffer for a semiconductor device and, more particularly, to an input buffer for a semiconductor device receiving an external reference potential and an external signal obtained by superposing a logic signal of a small amplitude on the external reference potential, comparing the external reference potential with the external signal and applying an internal signal corresponding to the result of comparison to an internal circuitry.

2. Description of the Background Art

As the speed of operation of microprocessors has been increased recently, speed of operation of a memory has also been increased. As to data transfer between devices, however, the speed of operation is limited when the conventional TTL (Transistor Transistor Logic) based interface is used. TTL based interface does not present any problem as along as the operational frequency is low. However, when the operational frequency is made higher, an overshoot or an undershoot of an output signal is noticed and, in addition, in a bus transmission system, irregularity of signals caused by reflection has come to be a serious problem. In view of the foregoing, a high speed interface in which signal amplitude is made smaller, has come to be practically used.

FIG. 4 is a partially omitted circuit block diagram showing a structure of a semiconductor integrated circuit device (for example, DRAM) employing an LVTTL (Low Voltage Transistor Transistor Logic) interface, which is one of the TTL based interfaces.

Referring to FIG. 4, semiconductor integrated circuit device 30 includes input buffers 31.1 to 31.m, internal circuitry 32 and output buffers 33.1 to 33.n. Input buffers 31.1 to 31.m receive external signals EXT1 to EXTm and generate and apply to internal circuitry 32 internal signals. Internal circuitry 32 performs a prescribed operation (in case of a DRAM, data writing/reading operation) in accordance with the internal signals applied from input buffers 31.1 to 31.m. Output buffers 31.1 to 33.n amplify and externally output signals D1 to Dn generated by internal circuitry 32.

FIG. 5 is a circuit diagram showing a structure of input buffer 31.m shown in FIG. 4. Referring to FIG. 5, input buffer 31.m includes P channel MOS transistors 44, 45 and N channel MOS transistors 46, 47. P channel MOS transistors 44 and 45 are connected between a line of power supply potential Vdd (3.3V) and an output node N46, respectively. N channel MOS transistors 46 and 47 are connected in series between an output node N46 and a line of ground potential Vss. MOS transistors 44 and 47 receive at their gates an input signal VI (external signal EXTm), and MOS transistors 45 and 46 receive at their gates an activating signal EN. Activating signal EN is set to an inactive level of "L" in a standby mode (power down mode, sleep mode) of semiconductor integrated circuit device 30 so as to reduce power consumption. Potential of output node N46 will be the output signal VO.

When activating signal EN is at the inactive level of "L", P channel MOS transistor 45 is rendered conductive, N channel MOS transistor 46 is rendered non-conductive, and the output signal VO is fixed at the "H" level regardless of the input signal VI. When activating signal EN rises to the active level of "H", P channel MOS transistor 45 is rendered non-conductive, N channel MOS transistor 46 is rendered conductive and input buffer 31.m is activated.

When input signal VI rises to "H" level (2V), P channel transistor 44 is rendered non-conductive, N channel MOS transistor 47 is rendered conductive, and output signal VO falls to the "L" level. When the input signal VI falls to the "L" level (0.8V), P channel MOS transistor 44 is rendered conductive, N channel MOS transistor 47 is rendered non-conductive, and output signal VO rises to the "H" level.

FIG. 6 is a partially omitted circuit block diagram showing an SSTL_3 (Stub Series Terminated Logic for 3.3V) interface, which is a high speed interface.

Referring to FIG. 6, in SSTL_3 interface, an output node 51a of an output buffer 51 in a transmitting side semiconductor integrated circuit device 50 is connected by a signal transmission line 54 to one input node 53a of an input buffer 53 in a receiving side semiconductor integrated circuit device 52. Output node 51a of output buffer 51 and one input node 53a of input buffer 53 receive terminating potential Vtt (1.5V) through resistance elements 55 and 56, respectively. The other input node 53b of input buffer 53 receives a reference potential VR (1.5V).

As shown in FIG. 7, input buffer 53 is constituted by a differential amplifying circuit, and it includes P channel MOS transistors 60 to 62 and N channel MOS transistors 63 and 64. P channel MOS transistor 60 is connected between a line of power supply potential Vdd and a node N60, and receives at its gate an activating signal ZEN. MOS transistors 61 and 63 as well as MOS transistors 62 and 64 are connected in series between node N60 and a line of ground potential Vss, respectively. P channel MOS transistors 61 and 62 have their gates connected together to a drain (node N61) of P channel MOS transistor 61.

P channel MOS transistors 61 and 62 constitute a current mirror circuit. Gates of N channel MOS transistors 63 and 64 receive reference potential VR and input signal VI respectively. N channel MOS transistors 63 and 64 constitute a differential transistor pair. Input signal VI is a signal obtained by superposing a logic signal of small amplitude on reference potential VR, and it swings between 1.5+04V and 1.5−0.4V. A potential at node N62 between P channel MOS transistor 62 and N channel MOS transistor 64 will be the output signal VO.

When the activating signal ZEN is at the inactive level of "H", P channel MOS transistor 62 is rendered non-conductive, and the output signal VO is fixed at the "L" level regardless of the input signal VI. When the activating signal ZEN falls to the active level of "L", P channel MOS transistor 60 is rendered conductive, current is supplied to each of nodes N61 and N62, and input buffer 53 is activated.

When input signal VI rises to the "H" level (1.9V), resistance value of N channel MOS transistor 64 attains smaller than the resistance value of N channel MOS transistor 63, so that output signal VO falls to the "L" level. When the input signal VI falls to the "L" level (1.1V), resistance value of N channel MOS transistor 64 attains higher than the resistance value of N channel MOS transistor 63, so that the output signal VO rises to the "H" level.

In the SSTL_3 interface, the potential of signal transmission line 54 has a small amplitude, and therefore high speed signal transmission is possible. Further, AC component of consumed power can be reduced. Further, as power consumption of output buffer 51 is small, output buffer 51 can readily be integrated.

However, in the SSTL_3 interface, it is necessary that the signal transmission line 54 is held at the terminating potential Vtt. Therefore, power is consumed to generate the terminating potential Vtt from power supply potential Vdd, which leads to the problem that power consumption of the overall system is increased. This is especially problematic in a system driven by a battery, such as a portable equipment.

Accordingly, a method has been proposed in which the terminating potential Vtt is set to be the same as power supply potential Vdd (3.3V), reference potential VR is set to 2.9V and the input signal VI is adapted to swing between 2.9+0.4V and 2.9−0.4V, as shown in FIG. 9. According to this method, the power consumed for generating terminating potential Vtt is eliminated, and therefore power consumption of the overall system can be reduced. However, in this method, the terminating potential Vtt is not the same as reference potential VR, and therefore the transition of the signal VI from "H" to "L" level is not balanced with transition from "L" to "H" level, and therefore the method is not suitable for high speed operation.

Therefore, another method has been proposed in which terminating potential Vtt is set to the power supply potential Vtt when the system is battery driven so that reduction in power consumption is given higher priority than high speed operation, while the terminating potential Vtt is set to an intermediate potential of 0.45×Vdd when the system is not battery driven but driven by the main power, so that high speed operation is given higher priority than reduction in power consumption.

In the input buffer 53 of FIG. 7, however, when terminating potential Vtt is set to the power supply potential Vdd and the reference potential VR is set to 2.9V, resistance value of N channel MOS transistor is made smaller as compared with the prior art example in which the terminating potential Vtt is set to the intermediate potential of 0.45×Vdd and reference potential VR to 1.5V, whereby intermediate level of logic amplitude of the output signal VO lowers as shown in FIG. 10, causing malfunction in the internal circuitry.

Further, according to the current trend of lowering power supply voltage of the semiconductor devices from 3.3V to 2.5V, lowering of input/output voltages has been required. In a 3.3V system, SSTL_3 interface has been standardized, while an SSTL_2 interface has been standardized for a 2.5V system. There is a demand to the side of the semiconductor device that semiconductor devices having the same structure should cope with both SSTL_2 and SSTL_3 interfaces.

In the SSTL_2 interface, however, reference potential VR is 1.25V. Therefore, resistance value of N channel MOS transistor attains higher than when the reference potential VR is 1.5V, and therefore an intermediate level of the logic amplitude of output signal VO increases as shown in FIG. 10, resulting in malfunction of the internal circuitry.

SUMMARY OF THE INVENTION

Therefore, an object of the present invention is to provide an input buffer for a semiconductor device which operates normally even when an arbitrary potential between first and second potentials is applied as an external reference potential.

Briefly stated, in the present invention, a potential converting circuit converts an external reference potential to a predetermined potential, a signal converting circuit converts an external signal to a signal obtained by superposing a complementary signal of a logic signal with small amplitude on a predetermined potential, a comparing circuit compares an output potential of the potential converting circuit with an output signal of the signal converting circuit, and outputs an internal signal based on the result of comparison. Therefore, even when an arbitrary potential between first and second potentials is applied as an external reference potential, normal operation is ensured.

Preferably, the potential converting circuit includes a resistance element connected between a first output node and a line of a first power supply potential, a first transistor of a first conductivity type connected between the first output node and a line of a second power supply potential, and receiving at an input electrode the external reference potential, and a second transistor of the first conductivity type connected parallel to the first transistor and having its input electrode connected to the first output node. When the external reference potential is low, the first transistor comes to have high resistance value while the second transistor comes to have low resistance value, and when the external reference potential is high, the first transistor comes to have low resistance value and the second transistor comes to have high resistance value. As a result, the potential at the first output node is kept constant.

More preferably, the signal converting circuit includes a third transistor of a second conductivity type connected between a second output node and the line of the first power supply potential, and receiving at its input electrode the output potential of the potential converting circuit, a fourth transistor of the first conductivity type connected between the second output node and the line of the second power supply potential and having its input electrode connected to the input electrode of the third transistor, and a fifth transistor of the first conductivity type connected parallel to the fourth transistor and receiving at the input electrode an external signal. When the external signal is at the same potential as the external reference potential, the second output node provides the external reference potential. As the potential of the external signal rises/lowers, the potential of the second output node rises/lowers. Therefore, at the second output node, a signal which is obtained by superposing a complementary signal of a logic signal with small amplitude on the external reference potential appears.

More preferably, the signal converting circuit further includes a sixth transistor of the second conductivity type connected parallel to the third transistor and having its input electrode connected to the second output node. In this case, difference in performance between the third transistor and the fourth and fifth transistors can be compensated for by the sixth transistor, and hence distortion in waveform of the output signal from the signal converting circuit can be prevented.

More preferably, the comparing circuit includes seventh and eighth transistors of the first conductivity type receiving the output potential of the potential converting circuit and the output signal from the signal converting circuit respectively, and a current mirror circuit for applying a current identical to the current flowing through one of the seventh and eighth transistor to the other. Accordingly, potential difference between the output potential of the potential converting circuit and the output signal of the signal converting circuit can be amplified and output.

The foregoing and other objects, features, aspects and advantages of the present invention will become more apparent from the following detailed description of the present invention when taken in conjunction the accompanying drawings.

DESCRIPTION OF THE PREFERRED EMBODIMENTS

Figure 1:
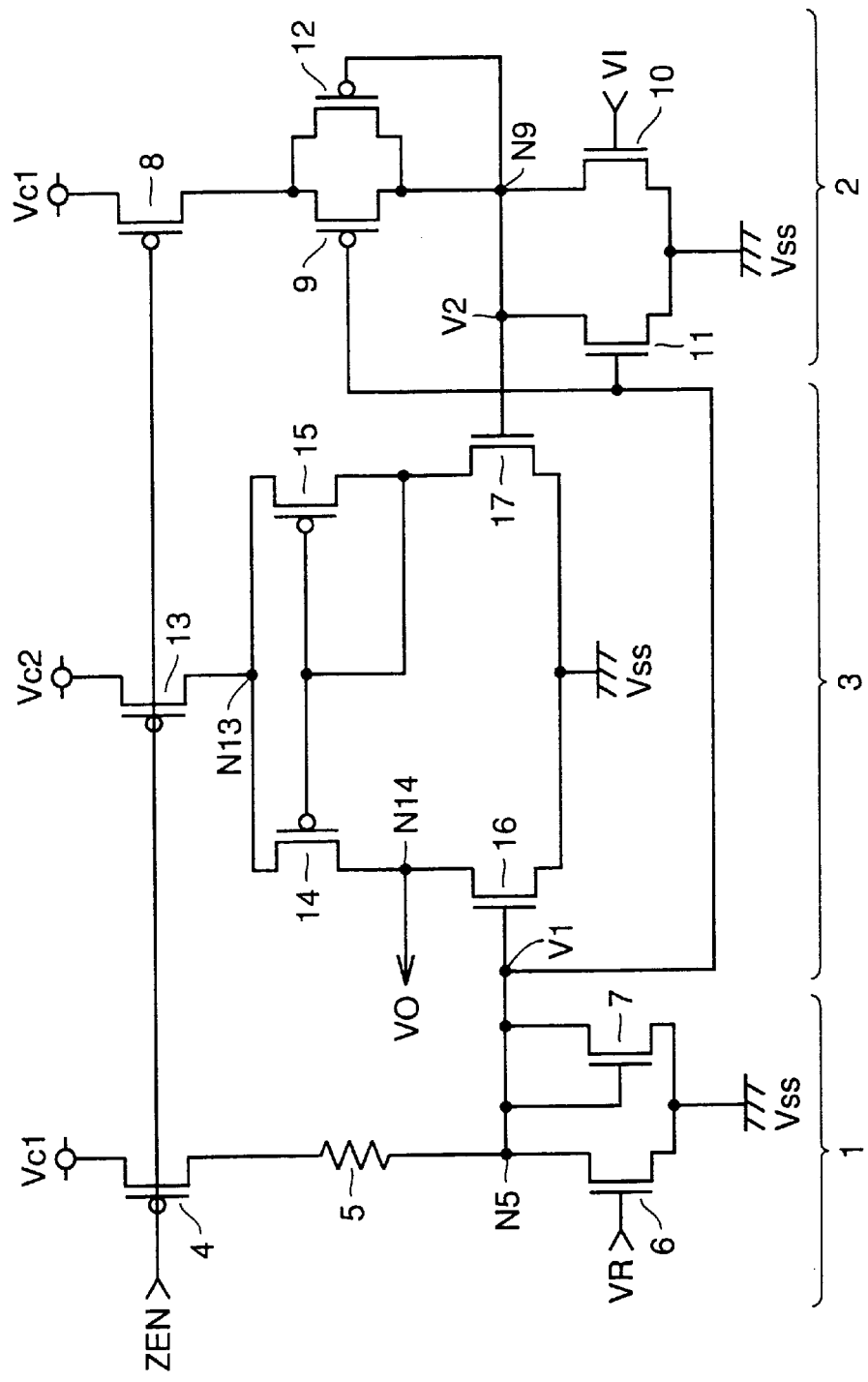
FIG. 1 is a circuit diagram showing a structure of an input buffer of the semiconductor integrated circuit device in accordance with a first embodiment of the present invention.

FIG. 1 is a circuit diagram showing a structure of an input buffer of the semiconductor integrated circuit device in accordance with the first embodiment of the present invention. Referring to FIG. 1, the input buffer includes voltage shift circuits 1 and 2 and a differential amplifying circuit 3.

Voltage shift circuit 1 includes a P channel MOS transistor 4, a resistance element 5 and an N channel MOS transistor 6 connected in series between a line of a first power supply potential Vc1 (3.3V) and a line of the ground potential Vss, and an N channel MOS transistor 7 connected parallel to N channel MOS transistor 6.

Figure 2:
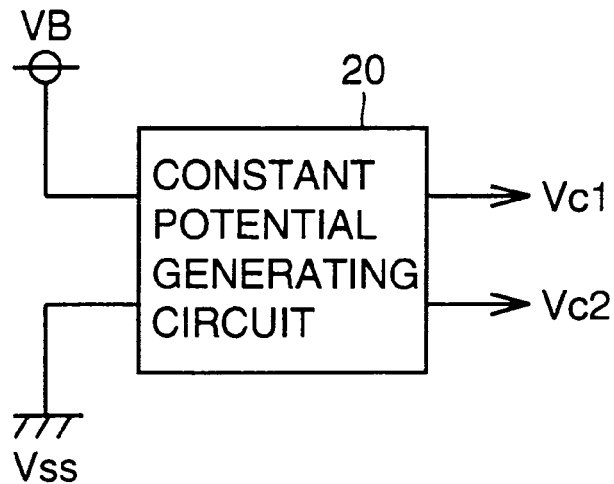
FIG. 2 is a block diagram showing a constant potential generating circuit for generating first and second power supply potentials shown in FIG. 1.

The first power supply potential Vc1 is generated by a constant potential generating circuit 20 as shown in FIG. 2. Constant potential generating circuit 20 generates the first power supply potential Vc1 (3.3V) and a second power supply potential Vc2 (2.5V) based on a power supply voltage VB. The power supply voltage VB may be applied from a battery, or generated based on a power from the mains. Constant potential generating circuit 20 is provided in the semiconductor integrated circuit device or, alternatively, in a portable equipment together with a battery and so on.

Figure 3A:
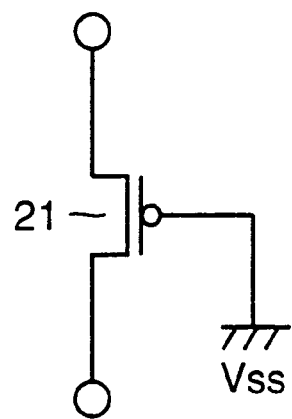
FIGS. 3A and 3B are circuit diagrams showing exemplary structures of resistance element shown in FIG. 1.
Figure 3B:
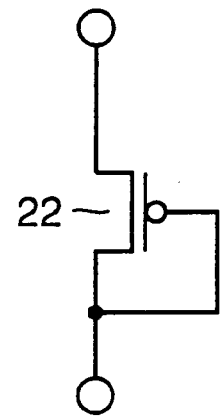
Figure 4:
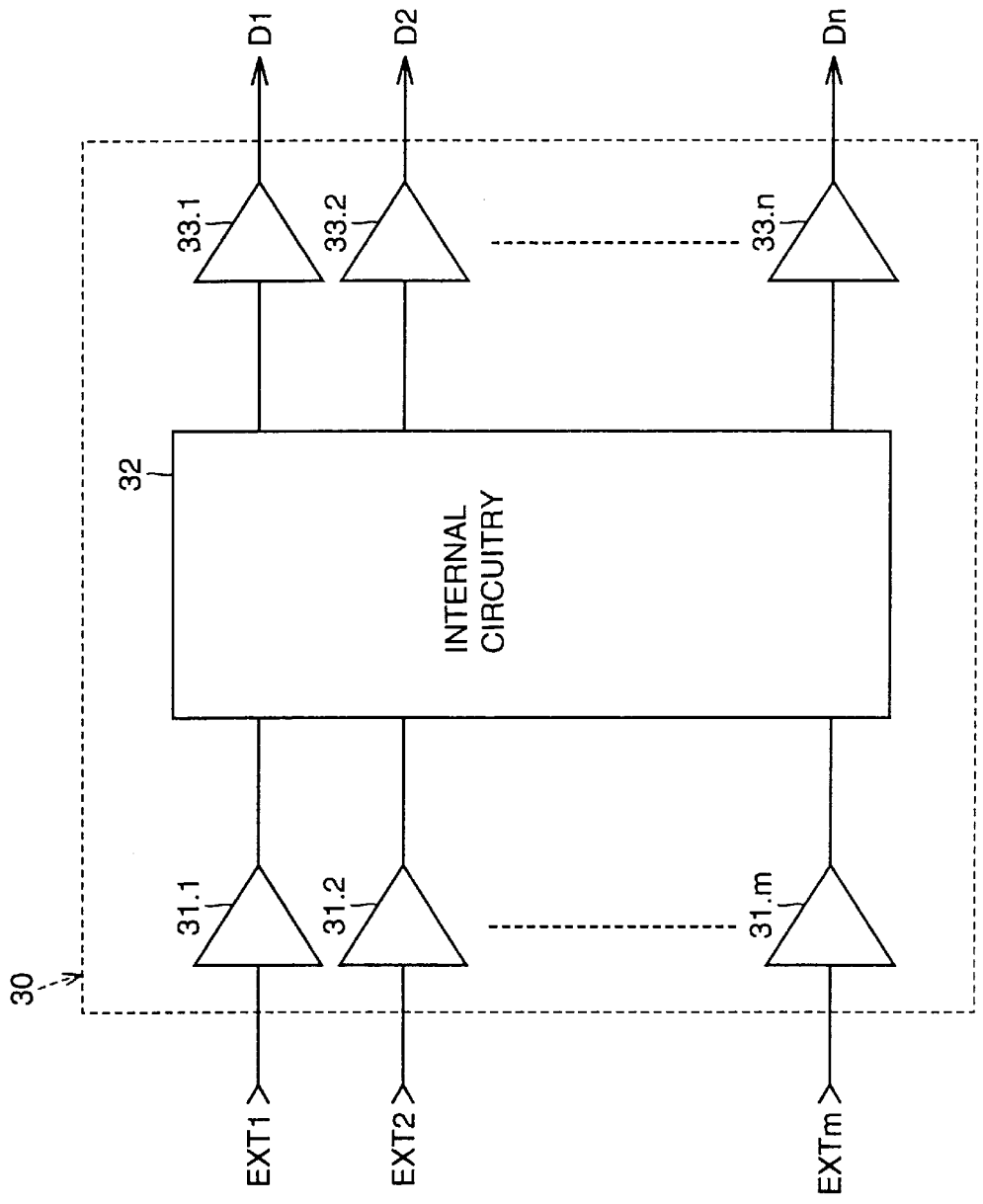
FIG. 4 is a circuit block diagram showing a structure of a conventional semiconductor integrated circuit device employing LVTTL interface.
Figure 5:
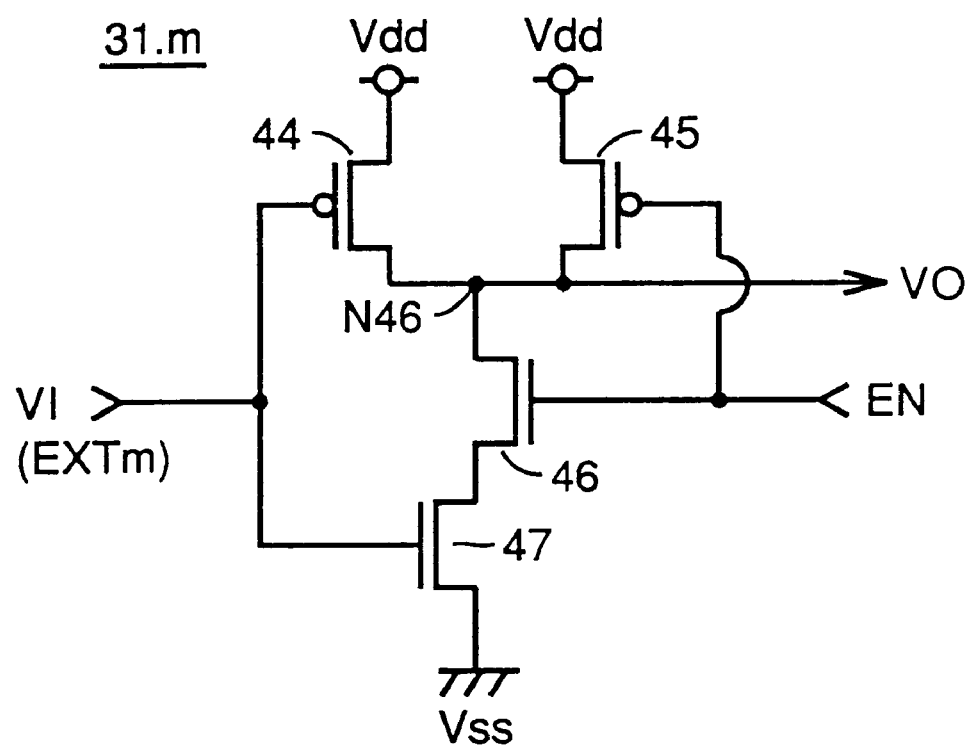
FIG. 5 is a circuit diagram showing a structure of the input buffer shown in FIG. 4.
Figure 6:
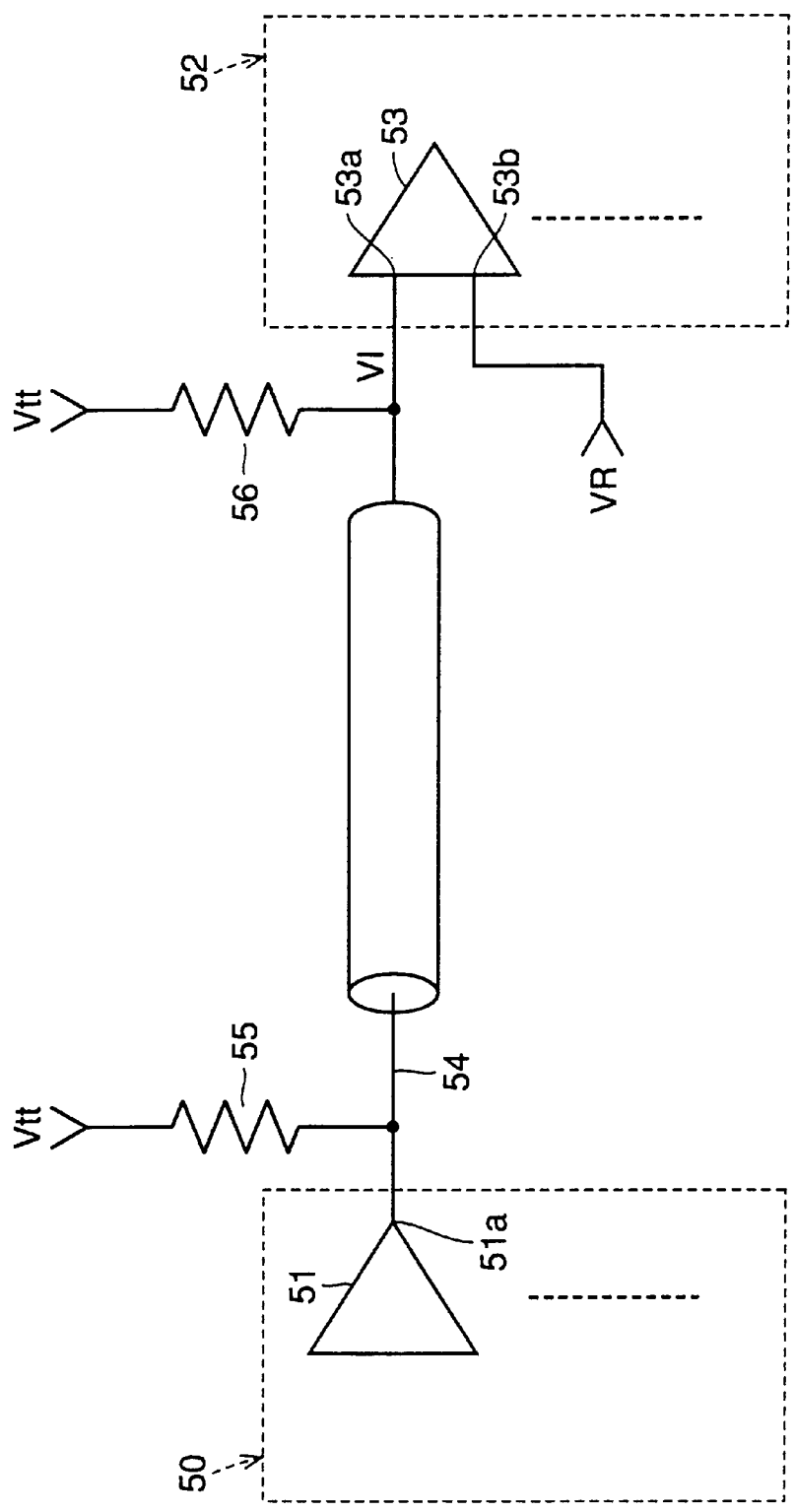
FIG. 6 is a circuit block diagram illustrating a method of signal transmission between conventional semiconductor integrated circuit devices employing SSTL_3 interface.

P channel MOS transistor 4 receives at its gate the activating signal ZEN. Resistance element 5 is constituted by a P channel transistor 21 having its gate connected to the line of the ground potential Vss, or a P channel MOS transistor 22 having its gate connected to the drain, as shown in FIGS. 3A and 3B. Potential at a node N5 between resistance element 5 and N channel MOS transistor 6 will be an output signal V1 of voltage shift circuit 1. N channel MOS transistor 7 receives at its gate the potential of node N5.

When reference potential VR is 1.25V, resistance value of N channel MOS transistor 6 attains to a relatively high level, and the level of the output signal V1 of voltage circuit 1 tends to be higher. However, the gate potential of N channel MOS transistor 7 connected parallel to N channel MOS transistor 6 increases, and therefore resistance value of N channel MOS transistor 7 decreases. As a result, the output signal V1 of voltage shift circuit 1 comes to have a constant potential (of, for example, 1.5V).

Conversely, when reference potential VR is 2.9V, resistance value of N channel MOS transistor 6 attains to a relatively low level, and the output signal V1 of voltage shift circuit 1 tends to be lower. However, gate potential of N channel MOS transistor 7 connected parallel to N channel MOS transistor 6 lowers, and hence the resistance value of N channel MOS transistor 7 increases. As a result, the output signal V1 of voltage shift circuit 1 comes to have a constant potential.

Voltage shift circuit 2 includes P channel MOS transistors 8 and 9 and an N channel MOS transistor 10 connected in series between the line of the first power supply potential Vc1 and the line of the ground potential Vss, an N channel MOS transistor 11 connected parallel to N channel MOS transistor 10, and a P channel MOS transistor 12 connected parallel to P channel MOS transistor 9. The gate of P channel MOS transistor 8 receives the activating signal ZEN. N channel MOS transistor 10 receives at its gate the input signal VI. P channel MOS transistor 9 and N channel MOS transistor 11 receive at their gates the output signal V1 of voltage shift circuit 1. The potential at node N9 between P channel MOS transistor 9 and N channel MOS transistor 10 will be an output signal V2 of voltage shift circuit 2. N channel MOS transistor 12 receives at its gate the potential of node N9.

When the input signal VI is the signal obtained by superposing a logic signal of small amplitude on a constant potential, then the output signal V2 of voltage shift circuit 2 changes with the output signal V1 of the voltage shift circuit 1 being the intermediate potential, as the gate potential of N channel MOS transistor 11 connected parallel to N channel MOS transistor 10 corresponds to the output signal V1 of voltage shift circuit 1. The gate potential of N channel MOS transistor 11 is not influenced by the superposed logic amplitude, the output signal V2 of voltage shift circuit 2 comes to be the signal having a complementary signal to the logic signal with small amplitude superposed on the output signal V1 of voltage shift circuit 1.

When a resistance element is used in place of P channel MOS transistor 9, amplitude of the signal V2 will be smaller than that of input signal VI. In FIG. 1, voltage shift circuits 1 and 2 constitute a differential amplifying circuit, and therefore the amplitude of signal V2 is the difference between reference potential VR and input signal VI differentially amplified. Therefore, the speed of operation of differential amplifying circuit 3 is not decreased.

Further, in voltage shift circuit 2, it is not possible to equalize current supplying capability of P channel MOS transistor 9 and N channel MOS transistors 10 and 11. Therefore, dependent on the voltage level of input signal VI, the time necessary for the output signal V2 to rise may possibly be significantly different from the time necessary for the output signal V2 to fall, whereby waveform of the output signal V2 is distorted. However, a negative feedback is provided for output signal V2 by providing P channel MOS transistor 12 of an appropriate size, so that difference in performance between P channel MOS transistor 9 and N channel MOS transistors 10 and 11 is compensated for, thus preventing distortion of output signal V2.

Differential amplifying circuit 3 includes P channel MOS transistors 13 to 15 and N channel MOS transistors 16 and 17. P channel MOS transistor 13 is connected to the line of the second power supply potential Vc2 (2.5V) and a node N13, and receives at its gate the activating signal ZEN. MOS transistors 14 and 16 and MOS transistors 15 and 17 are connected in series between node N13 and the line of the ground potential Vss, respectively. P channel MOS transistors 14 and 15 have their gates connected together to the drain of P channel MOS transistor 15. P channel MOS transistors 14 and 15 constitute a current mirror circuit. N channel MOS transistors 16 and 17 receive at their gates output signals V1 and V2 of voltage shift circuits 1 and 2, respectively. N channel MOS transistors 16 and 17 constitute a differential transistor pair. Potential at a node N14 between P channel MOS transistor 14 and N channel MOS transistor 16 will be an output signal VO.

The operation of the input buffer will be described. When the activating signal ZEN is at the inactive level of "H", P channel MOS transistors 4, 8 and 13 are rendered non-conductive, and the input buffer is inactivated. When the activating signal ZEN falls to the active level of "L", P channel MOS transistors 4, 8 and 13 are rendered conductive, and the input buffer is activated.

When the terminating potential Vtt and the reference potential VR are both at 1.25V (when VR=0.45×Vdd in the SSTL_2 interface), the levels of output signals V1 and V2 of voltage shift circuits 1 and 2 tend to be higher and, at the same time, the gate potential of N channel MOS transistor 7 attains higher and the resistance value of N channel MOS transistor 7 attains lower. Therefore, the potentials of output signals V1 and V2 of voltage shift circuits 1 and 2 are not increased.

When the terminating voltage Vtt is the power supply potential Vdd (3.3V) and the reference potential VR is 2.9V, output signals V1 and V2 of voltage shift circuits 1 and 2 tend to have lower levels and, at the same time, the gate potential of N channel MOS transistor 7 attains lower and the resistance value of N channel MOS transistor 7 attains higher. Therefore, potentials of output signals V1 and V2 of voltage shift circuits 1 and 2 do not attain lower.

Figure 7:
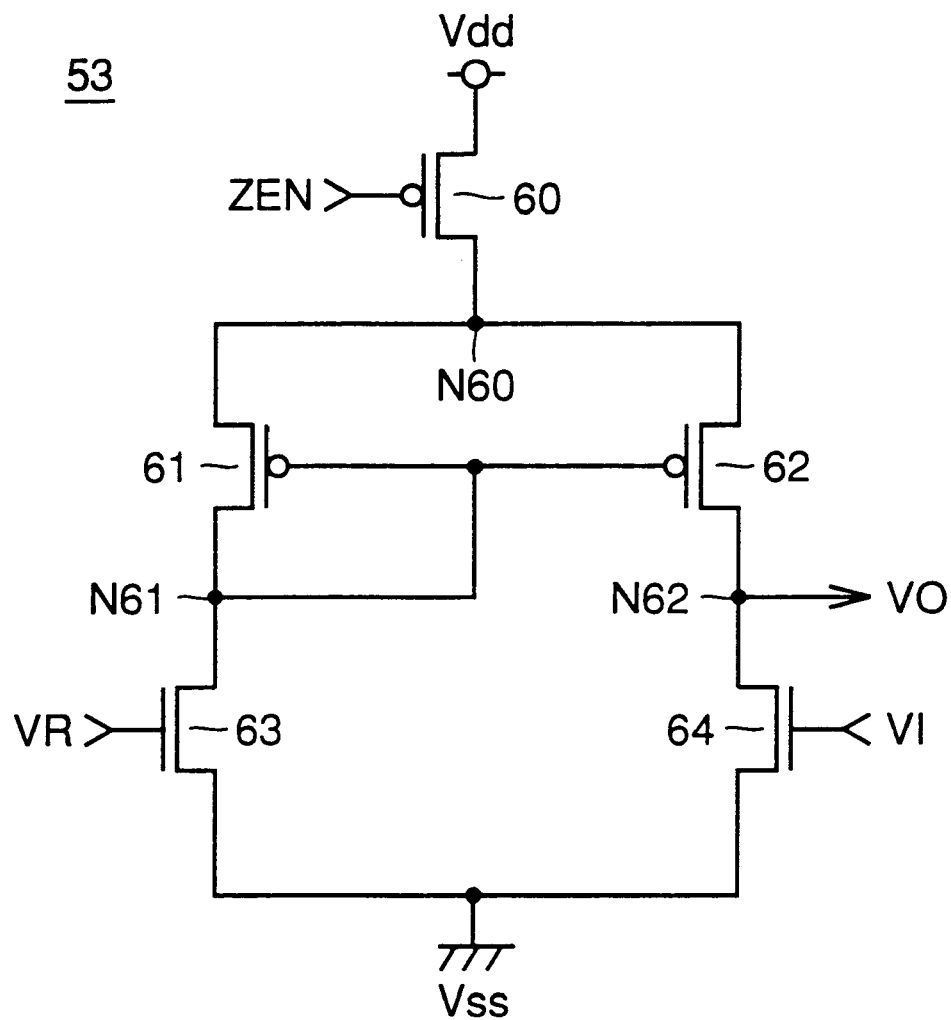
FIG. 7 is a circuit diagram showing a structure of the input buffer shown in FIG. 6.
Figure 8:
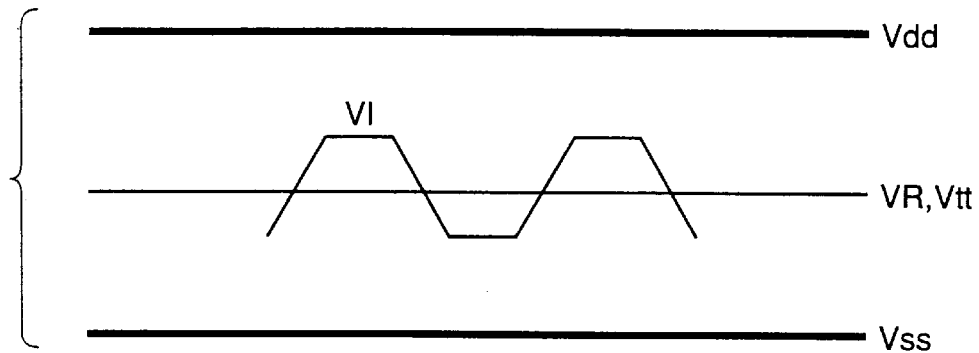
FIG. 8 is a diagram of signal waveforms showing relation between each of input signal VI, reference potential VR, terminating potential Vtt and power supply potential Vdd shown in FIG. 6.
Figure 9:
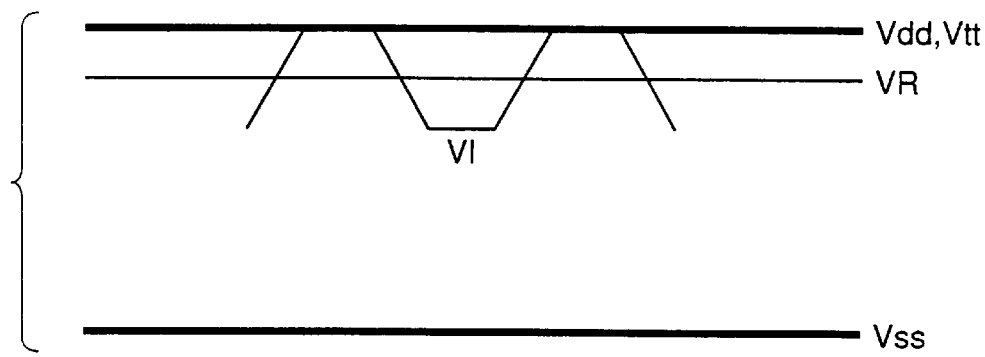
FIG. 9 is a diagram of signal waveforms illustrating a proposal for improving SSTL_3 interface shown in FIGS. 6 to 8.
Figure 10:
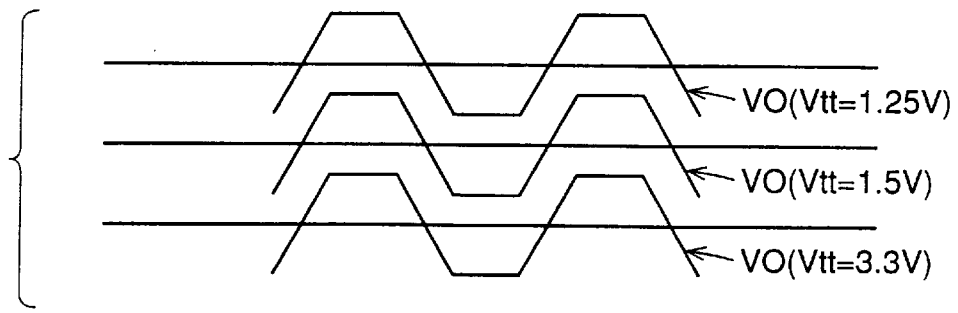
FIG. 10 is a diagram of waveforms showing a problem of the proposal described with reference to FIG. 9.

When the input signal VI is higher than the reference potential VR, the level of the signal V2 attains lower than that of signal V1, and the output signal VO attains to the "L" level. Conversely, when the input signal VI is lower than the reference potential VR, the level of the signal V2 attains higher than that of signal V1, and the output signal VO attains to the "H" level. Therefore, the relation between the input signal VI and output signal VO is the same as that of the input buffer shown in FIG. 7.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An input buffer for a semiconductor device receiving as an external reference potential an arbitrarily potential between first and second potentials, and an external signal obtained by superposing a logic signal of a small amplitude on said external reference potential, comparing said external reference potential with said external signal and applying an internal signal in accordance with result of comparison to an internal circuitry, comprising:

a potential converting circuit for converting said external reference potential to a predetermined potential and outputting the converted potential;

a signal converting circuit for converting said external signal to a signal obtained by superposing a complementary signal of said logic signal with small amplitude on said predetermined potential and outputting the converted signal; and a comparing circuit for comparing an output potential of said potential converting circuit with an output signal of said signal converting circuit and outputting said internal signal based on a result of comparison.

2. The input buffer for a semiconductor device according to claim 1, wherein said potential converting circuit includes a first output node to which said predetermined potential is output, a resistance element connected between said first output node and a line of a first power supply potential, a first transistor of a first conductivity type connected between said first output node and a line of a second power supply potential and receiving at an input electrode said external reference potential, and a second transistor of the first conductivity type connected parallel to said first transistor and having an input electrode connected to said first output node.

3. The input buffer for a semiconductor device according to claim 2, wherein said signal converting circuit includes a second output node to which the signal obtained by superposing a complementary signal of said logic signal with small amplitude on said predetermined potential is output, a third transistor of a second conductivity type connected between said second output node and the line of the first power supply potential and receiving at an input electrode the output potential of said potential converting circuit, a fourth transistor of the first conductivity type connected between said second output node and the line of the second power supply potential, and having an input electrode connected to an input electrode of said third transistor, and a fifth transistor of the first conductivity type connected parallel to said fourth transistor and receiving at an input electrode said external signal.

4. The input buffer for a semiconductor device according to claim 3, wherein said signal converting circuit further includes a sixth transistor of the second conductivity type connected parallel to said third transistor and having an input electrode connected to said second output node.

5. The input buffer for a semiconductor device according to claim 4, wherein said comparing circuit includes third and fourth output nodes to which said internal signal is output, seventh and eighth transistors of the first conductivity type connected between said third and fourth output nodes and the line of said second power supply potential respectively, and receiving at respective input electrodes, the output potential of said potential converting circuit and the output signal of said signal converting circuit, respectively, and a current mirror circuit connected between a line of a third power supply potential and said third and fourth output nodes, for applying a current identical to a current flowing through one of said first and fourth output nodes to the other.